(12) United States Patent
Meng et al.

(10) Patent No.: US 11,990,558 B2
(45) Date of Patent: May 21, 2024

(54) TRANSFERABLE LIGHT EMITTING DEVICE ARRAY AND PRODUCTION METHOD THEREOF

(71) Applicant: XIAMEN SAN'AN OPTOELECTRONICS CO., LTD., Xiamen (CN)

(72) Inventors: Cheng Meng, Tianjin (CN); Chingyuan Tsai, Tianjin (CN); Chun-I Wu, Tianjin (CN)

(73) Assignee: Xiamen San'an Optoelectronics Co., Ltd., Hongtang Town (CN)

( * ) Notice: Subject to any disclaimer, the term of this patent is extended or adjusted under 35 U.S.C. 154(b) by 450 days.

(21) Appl. No.: 16/908,114

(22) Filed: Jun. 22, 2020

(65) Prior Publication Data

US 2020/0403114 A1    Dec. 24, 2020

(30) Foreign Application Priority Data

Jun. 24, 2019 (CN) .......................... 201910551455.5

(51) Int. Cl.
*H01L 33/00* (2010.01)
*H01L 25/075* (2006.01)

(52) U.S. Cl.
CPC ........ *H01L 33/005* (2013.01); *H01L 25/0753* (2013.01)

(58) Field of Classification Search
CPC ............... H01L 33/005; H01L 25/0753; H01L 21/67144; H01L 2221/68313; H01L 21/6835; H01L 33/62; H01L 2221/68354; H01L 2221/68381
See application file for complete search history.

(56) References Cited

U.S. PATENT DOCUMENTS

| | | | | |
|---|---|---|---|---|
| 2015/0179876 | A1* | 6/2015 | Hu | H01L 33/20 257/13 |
| 2018/0179876 | A1* | 6/2018 | Delchambre | E21B 28/00 |
| 2018/0240952 | A1* | 8/2018 | Moon | H01L 33/382 |
| 2018/0301597 | A1* | 10/2018 | Park | H01L 33/14 |
| 2018/0351032 | A1* | 12/2018 | Wu | H01L 33/025 |
| 2020/0152693 | A1* | 5/2020 | Zou | H01L 27/153 |

* cited by examiner

*Primary Examiner* — Ratisha Mehta
(74) *Attorney, Agent, or Firm* — Thomas | Horstemeyer, LLP

(57) ABSTRACT

A method for producing a transferable array of light emitting devices includes forming a plurality of light emitting devices on a temporary substrate, forming at least one supporting member that is directly connected to a release layer of at least one of the light emitting devices, connecting a supporting substrate only with the at least one supporting member so that the at least one supporting member extends from the release layer of the at least one of the light emitting devices to the supporting substrate and so that the light emitting devices are spaced apart from the supporting substrate, and removing the temporary substrate. The transferable array produced by the method is also disclosed.

14 Claims, 19 Drawing Sheets

TRANSFERABLE LIGHT EMITTING DEVICE ARRAY AND PRODUCTION METHOD THEREOF

CROSS-REFERENCE TO RELATED APPLICATION

This application claims priority of Chinese Patent Application No. 201910551455.5, filed on Jun. 24, 2019.

FIELD

The disclosure relates to a transferable array of light emitting devices and a production method thereof, and more particularly to a transferable array of micro-size light emitting devices and a production method thereof.

BACKGROUND

Micro light emitting diodes (microLEDs) are products of emerging display technology, and may provide higher brightness, better light emission efficiency, and lower power consumption compared to organic light emitting diodes (OLEDs). To produce a microLED display, LED structures are subjected to thickness reduction, miniaturization, and ordered arrangement so as to have a size ranging from 1 µm to 100 µm. Subsequently, such LED structures are massively transferred to a circuit board, and a protection layer and an upper electrode are formed through physical deposition. Accordingly, an upper substrate can be provided for packaging to accomplish the production of the microLED display.

Conventionally, to transfer microLEDs to a desired location, a sacrificial layer is used to support the microLEDs on a supporting substrate, and the sacrificial layer is subsequently removed through wet etching. The sacrificial layer is normally made from titanium (Ti), titanium-tungsten (TiW), etc. Before removing the sacrificial layer by wet etching, bridge structures interconnecting the microLEDs, as well as a suitable etching process, must be designed, such that the supporting substrate is able to support the microLEDs through the bridge structures after the removal of the sacrificial layer. However, a wet etching process usually involves a strong reaction leading to release of a great amount of heat and gas bubbles, thus adversely impacting greatly the bridge structures. As a consequence, the bridge structures might be easily damaged (structurally weakened or broken), reducing the success rate of mass transfer of the microLEDs (due to weaker support of the microLEDs by the damaged bridge structures) and further decreasing the production yield of a device composed of the microLEDs. In addition, the aforesaid conventional mass transfer method has other drawbacks described below.

The sacrificial layer is coated on surfaces of the microLEDs. However, parts of the sacrificial layer might remain on the surfaces of the microLEDs after the wet etching process, adversely influencing the brightness. Moreover, during the wet etching process, the suspended portions of the bridge structures might be easily broken due to sudden stress relief which gives rise to mechanical imbalance, negatively affecting the success rate of mass transfer (due to weaker support of the microLEDs by the broken bridge structures) and further decreasing the production yield of a device composed of the microLEDs.

Lastly, red light-emitting epitaxial structures, in particular those containing aluminum or gallium arsenide, might be damaged (e.g. etched) during the wet etching process.

SUMMARY

Therefore, an object of the disclosure is to provide a transferable array of light emitting devices and a production method thereof that can alleviate at least one of the drawbacks of the prior art.

The production method includes the following steps. A plurality of light emitting devices are formed on a temporary substrate. Each of the light emitting devices includes a light emitting structure and a release layer disposed over the light emitting structure. At least one supporting member is formed so that the at least one supporting member is directly connected to the release layer of at least one of the light emitting devices. A supporting substrate is connected only with the at least one supporting member so that the at least one supporting member extends from the release layer of the at least one of the light emitting devices to the supporting substrate for supporting the light emitting devices on the supporting substrate, and so that the light emitting devices are spaced apart from the supporting substrate. The temporary substrate is removed.

The transferable array of light emitting devices includes a plurality of light emitting devices, at least one supporting member, and a supporting substrate. Each of the light emitting devices includes a light emitting structure and a release layer disposed over the light emitting structure. The at least one supporting member is directly connected to the release layer of at least one of the light emitting devices. The supporting substrate is connected only with the at least one supporting member so that the at least one supporting member extends from the release layer of the at least one of the light emitting devices to the supporting substrate for supporting the light emitting devices on the supporting substrate, and so that the light emitting devices are spaced apart from the supporting substrate.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
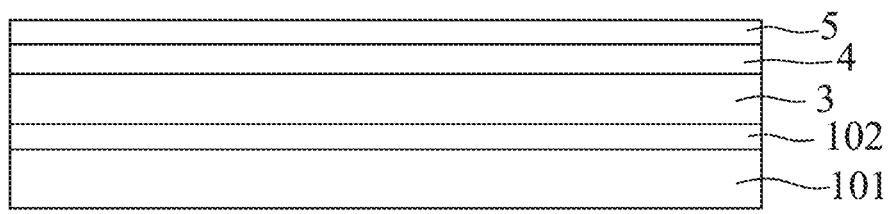
FIG. 1 is a schematic sectional view illustrating step 1 in a first embodiment of a method for producing a transferable array of light emitting devices.

Before the disclosure is described in greater detail, it should be noted that where considered appropriate, reference numerals or terminal portions of reference numerals have been repeated among the figures to indicate corresponding or analogous elements, which may optionally have similar characteristics.

FIGS. 1 to 13 illustrate a first embodiment of a transferable array of light emitting devices, a first embodiment of a method for producing the first embodiment of the transferable array, and variations thereof.

The term "array" refers to any arrangement of at least two light emitting devices for a particular illumination application, whether in one or more regularly-spaced or irregularly-spaced strings, or in a geometric or empirically placed "best practical location" arrangement.

The first embodiment of the method includes steps 1 to 4 described below.

Figure 4:
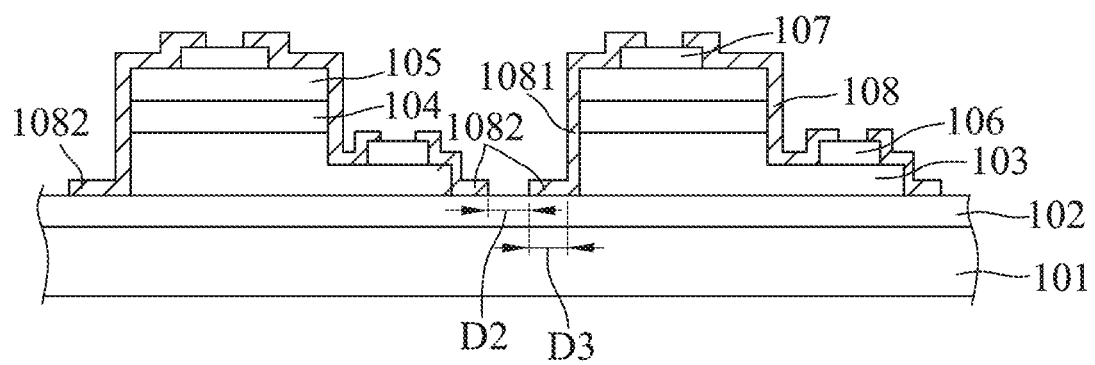
FIG. 4 is a fragmentary, enlarged schematic sectional sectional view illustrating light emitting devices obtained after step 1 of the first embodiment of the production method.
Figure 5:
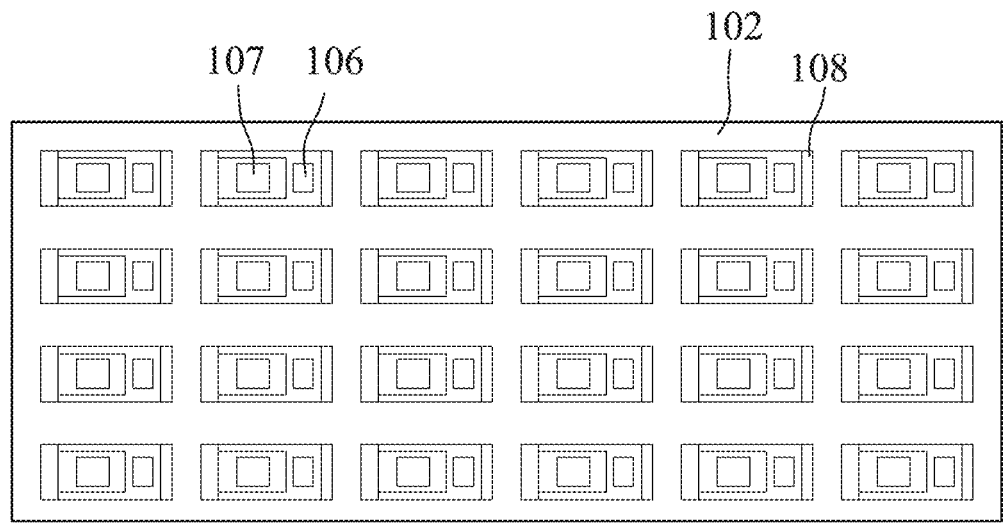
FIG. 5 is a schematic top view illustrating the light emitting devices shown in FIG. 4.

In step 1, referring to FIGS. 4 and 5, a plurality of light emitting devices in an array are formed on a temporary substrate 101. Each of the light emitting devices includes a light emitting structure that is made from a semiconductor material, and a release layer 108 that is disposed over the light emitting structure and on the temporary substrate 101.

The temporary substrate 101 may be made from a material selected from the group consisting of sapphire, quartz, silicon, GaAs, GaN, InP, SiC, GaP, GaSb, AlN, MgO, and combinations thereof.

In this embodiment, an intermediate layer 102 is provided between the light emitting devices and the temporary substrate 101. The intermediate layer 102 may be a layer which serves to assist in separating the temporary substrate 101 and the light emitting devices, for instance, an etch stop layer or a laser ablation layer. Alternatively, the intermediate layer 102 may be a layer which serves to increase growth quality of a semiconductor material, for example, a buffer layer or a transition layer. The intermediate layer 102 may be simultaneously removed during removal of the temporary substrate 101 to separate the light emitting devices from the temporary substrate 101.

To form the light emitting devices on the intermediate layer 102 (i.e. indirectly on the temporary substrate 101), as shown in FIG. 1, a semiconductor layer structure is grown on the intermediate layer 102 through a suitable technique such as metal-organic chemical vapor deposition (MOCVD), liquid phase epitaxy (LPE), etc. The semiconductor layer structure at least includes an electrically conductive first-type semiconductor layer 3 that is disposed on the intermediate layer 102, an active layer 4 that is disposed on the first-type semiconductor layer 3 opposite to the intermediate layer 102, and a second-type semiconductor layer 5 that is disposed on the active layer 4 opposite to the first-type semiconductor layer 3.

The term "first-type" refers to being doped with a first conductivity type dopant, and the term "second-type" refers to being doped with a second conductivity type dopant that is opposite in conductivity type to the first conductivity type dopant. For instance, the first conductivity type dopant may be an n-type dopant, and the second conductivity type dopant may be a p-type dopant, and vice versa.

The semiconductor layer structure may be made from a material selected from the group consisting of aluminum gallium indium nitride (AlGaInN), aluminium gallium nitride (AlGaN), gallium nitride (GaN), aluminium gallium arsenide (AlGaAs), aluminum gallium indium phosphide (AlGaInP), aluminum indium phosphide (AlInP), and combinations thereof.

The active layer 4 serves to provide light radiation when electricity is supplied, and may provide radiation of light having a wavelength ranging from 200 nm to 950 nm. For instance, the active layer 4 may emit at least one of the following: violet light, blue light, green light, yellow light, red light, and infrared light. The active layer 4 may have a single quantum well structure or a multiple quantum well structure.

The semiconductor layer structure may have a thickness ranging from 2 μm to 10 μm (for example, 5 μm to 8 μm).

In this embodiment, the semiconductor layer structure has no insulating or electrically conductive permanent substrate.

Figure 2:
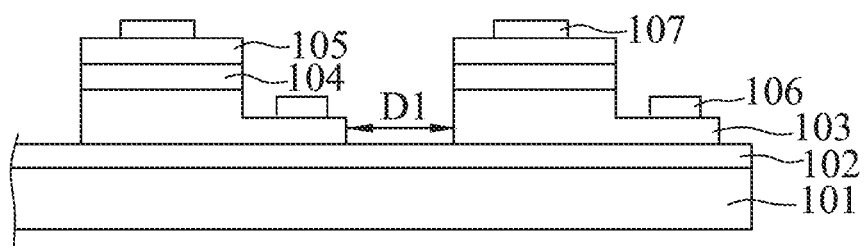
FIG. 2 is a fragmentary, enlarged schematic sectional view illustrating step 1 of the first embodiment of the production method.
Figure 3:
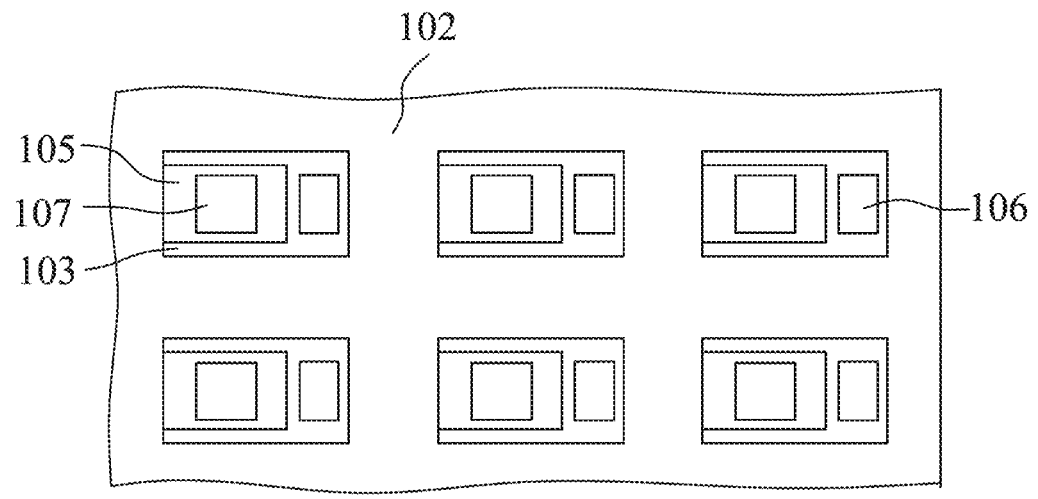
FIG. 3 is a fragmentary, enlarged schematic top view illustrating step 1 of the first embodiment of the production method.

Referring to FIGS. 2 and 3, the semiconductor layer structure is subjected to patterning to form the light emitting structures of the light emitting devices in an array (for instance, patterning may be conducted through a photolithography process involving a photoresist and an etching step), such that each of the light emitting structures of the light emitting devices includes a first-type semiconductor layer portion 103 (i.e. a separated portion of the first-type semiconductor layer 3), an active layer portion 104 (i.e. a separated portion of the active layer 4), and a second-type semiconductor layer portion 105 (i.e. a separated portion of the second-type semiconductor layer 5). The light emitting structures of two adjacent ones of the light emitting devices arranged in a row are spaced apart by a distance D1. In this embodiment, the distance D1 is the distance between confronting side surfaces of the first-type semiconductor layer portions 103 of the two adjacent ones of the light emitting devices arranged in a row.

Further, for electrical connection, a first electrode 106 is formed on the respective first-type semiconductor layer portion 103, and a second electrode 107 is formed on the respective second-type semiconductor layer portion 105. In this embodiment, the first and second electrodes 106, 107 are disposed on the same side of the respective light emitting structure (i.e. the side facing away from the intermediate layer 102) for external electrical connection.

Each of the light emitting devices may have at least one width that extends horizontally and that is not greater than 100 μm (for example, a width ranging from 1 μm to 50 μm, or a width ranging from 50 μm to 100 μm). Alternatively, when the light emitting devices have a larger width and a smaller width that extend horizontally (for instance, see FIGS. 3 and 4, when the first-type semiconductor layer portion 103 has a larger width and the active layer portion 104 and the second-type semiconductor layer portion 105 have a smaller width), both of the larger and smaller widths may be not greater than 100 μm.

Referring back to FIGS. 4 and 5, specifically, the release layer 108 of the light emitting structure of each light emitting device has a first portion 1081 which is disposed over the respective light emitting structure, and two second portions 1082, each of which extends horizontally from the first portion 1081 to terminate at a terminal end and is disposed only on the intermediate layer 102 (i.e. indirectly on the temporary substrate 101).

The light emitting structure of each of the light emitting devices has a lower surface that is disposed on the intermediate layer 102, an upper surface and an intermediate surface that are opposite to the lower surface and that are different in height, and lateral walls that respectively extend laterally of the upper and intermediate surfaces. The first portion 1081 of the release layer 108 of each of the light emitting devices may be disposed over the upper and intermediate surfaces and/or the lateral walls.

The release layer 108 may be an insulation layer which may be transparent, and which can serve to protect the respective light emitting structure, in particularly to prevent water vapor permeation or electric leakage. The release layer 108 may be made from an electrically insulating material such as a nitride material, an oxide material, a fluoride material, and other suitable transparent materials. For instance, the release layer 108 may be made from a material selected from the group consisting of silicon nitride, silicon oxide, magnesium fluoride, titanium oxide, magnesium oxide, titanium nitride, and combinations thereof. The release layer 108 may have a refractive index lower than that of the respective light emitting structure.

In this embodiment, the confronting second portions 1082 of the release layers 108 of the two adjacent ones of the light emitting devices arranged in a row are spaced apart from each other by a distance D2 (namely, the two adjacent ones of the light emitting devices arranged in a row are spaced apart by the distance D2), such that the intermediate layer 102 is partially exposed. The distance D2 is smaller than the distance D1. The confronting second portions 1082 of the release layers 108 of the two adjacent ones of the light emitting devices arranged in a row are to form a bridge structure as described later.

In this embodiment, at least one of the second portions 1082 of the release layer 108 of the respective light emitting device has a width D3.

Even though each release layer 108 has two second portions 1082 disposed at two sides of the respective light emitting structure in this embodiment (see FIG. 5), the release layer 108 may have only one second portion 1082 or more than two second portions 1082 in other embodiments. In the case of only one second portion 1082, such second portion 1082 is disposed at one side of the respective light emitting structure. In the case of more than two second portions 1082, such second portions 1082 are disposed at more than two sides of the respective light emitting structure.

Figure 6:
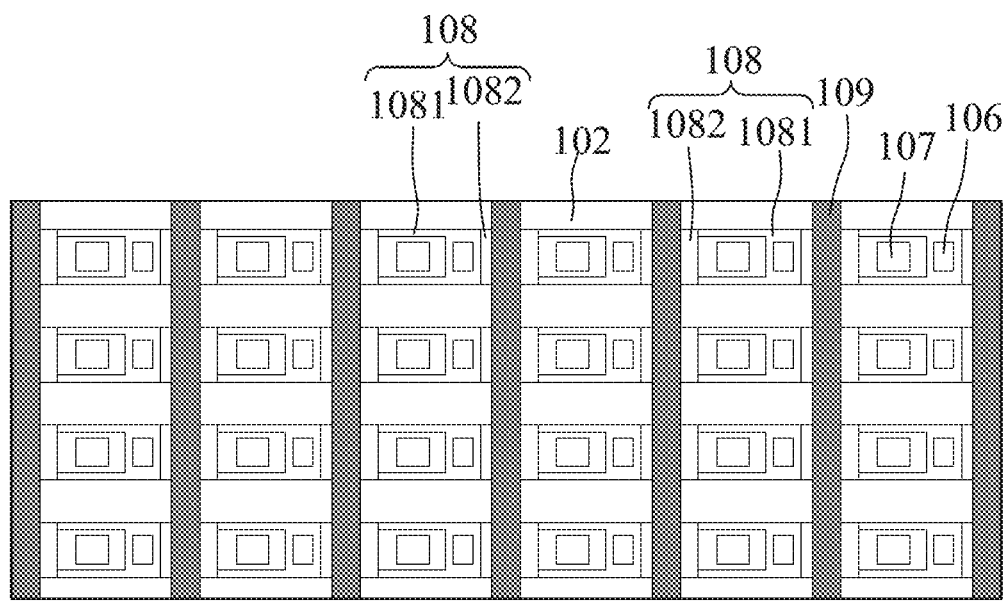
FIG. 6 is a schematic top view illustrating step 2 of the first embodiment of the production method.
Figure 7:
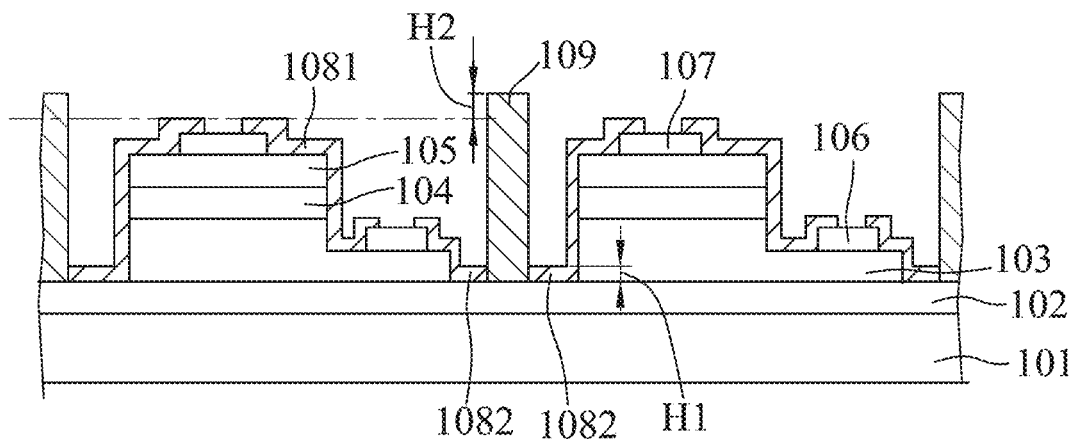
FIG. 7 is a fragmentary, enlarged schematic sectional view illustrating step 2 of the first embodiment of the production method.

In step 2, as shown in FIGS. 6 and 7, a plurality of supporting members 109 are formed on the intermediate layer 102 (i.e. indirectly on the temporary substrate 101), so that the two second portions 1082 of the release layer 108 of each of the light emitting devices are directly connected to (i.e. in contact with) two of the supporting members 109, respectively. Each of the supporting members 109 has a bottom part that is disposed on the intermediate layer 102, a top part that is opposite to the bottom part and faces away from the intermediate layer 102, and an intermediate part that interconnects the top and bottom parts. Each of the terminal supporting members 109 (i.e. the supporting members 109 arranged in the leftmost and rightmost columns shown in FIG. 6) is disposed to be connected to one second portion 1082 of the release layer 108 of one of the light emitting devices arranged in a column, so that each of these supporting members 109 cooperates with the corresponding second portion 1082 to form a bridge structure for later supporting the corresponding light emitting device. The non-terminal supporting members 109 (which are disposed between the terminal supporting members 109) are each disposed between the spaced apart confronting second portions 1082 of the two adjacent ones of the light emitting devices arranged in a row, so that each of these supporting members 109 cooperates with the spaced apart confronting second portions 1082 to form a bridge structure for later supporting the two adjacent light emitting devices.

One of the bottom and intermediate parts of a respective one of the supporting members 109 may be directly connected to one second portion 1082 of the release layer 108 of one or two light emitting devices.

The supporting members 109 may be selected from supporting pillars in an array, supporting mesa components for forming supporting mesas in an array, and patterned supporting frames. Moreover, the supporting members 109 may have a horizontal cross-section which is circular, rectangular, square, or elliptical, and a longitudinal cross-section which is trapezoidal or square. As shown in FIG. 6, in this embodiment, the supporting members 109 are supporting mesa components, and the supporting mesa components connected in each column form a supporting mesa in the form of a bar.

Figure 8:
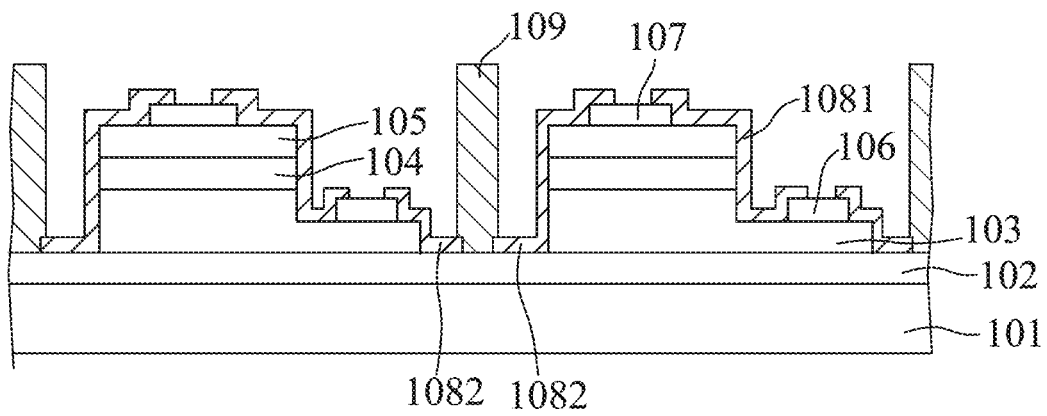
FIG. 8 is a fragmentary, enlarged schematic sectional view illustrating a variation of step 2 of the first embodiment of the production method.

In this embodiment, as shown in FIG. 7, the bottom part of each supporting member 109 is disposed completely on the intermediate layer 102, and each supporting member 109 is connected to, only at the intermediate part, the terminal end of one second portion 1082 or the terminal ends of two spaced-apart confronting second portions 1082. Alternatively, as shown in FIG. 8, the intermediate part of each supporting member 109 is connected to and disposed partially on (specifically, partially rests on) the terminal end of one second portion 1082 or the terminal ends of two spaced-apart confronting second portions 1082.

The supporting members 109 may be in no contact with the components of the light emitting structures of the light emitting devices other than the release layers 108. The supporting members 109 may be arranged in an array or patterned among the light emitting devices.

Each of the supporting members 109 may be made from a material selected from the group consisting of a metal, a metal alloy (e.g. AuSn), a curable resin, and combinations thereof. Examples of the curable resin include, but are not limited to, a silicon resin, a benzocyclobutene (BCB) resin, a polyimide (PI) resin, an epoxy resin (such as SU-8), and a photosensitive resin. To form the supporting members 109, a suitable material may be patterned through photolithography and subsequently heated to be cured.

Referring back to FIG. 7, the top part of each of the supporting members 109 is higher than the top of the respective light emitting device by a distance H2. The distance H2 may be larger than or equal to 3 μm. That is, each of the supporting member 109 has a height greater than that of each of the light emitting devices. In addition, the second portions 1082 of the release layers 108 have a height H1 that is measured from the intermediate layer 102.

The direct contact connection between the supporting members 109 and the corresponding second portions 1082 of the release layers 108 are stable and secure at least due to the intermolecular forces between the material of the supporting members 109 and that of the second portions 1082 of the release layers 108, such as van der Waals forces leading to adhesion. The aforesaid direct contact connection can be further enhanced by increasing the contact area to strengthen the adhesion. For instance, as shown in FIG. 8 (which illustrates a variation of the first embodiment), the intermediate part of the supporting members 109, which partially rests on the respective second portions 1082 of the release layers 108 to increase the contact area, can serve to enhance the direct contact connection.

Figure 9:
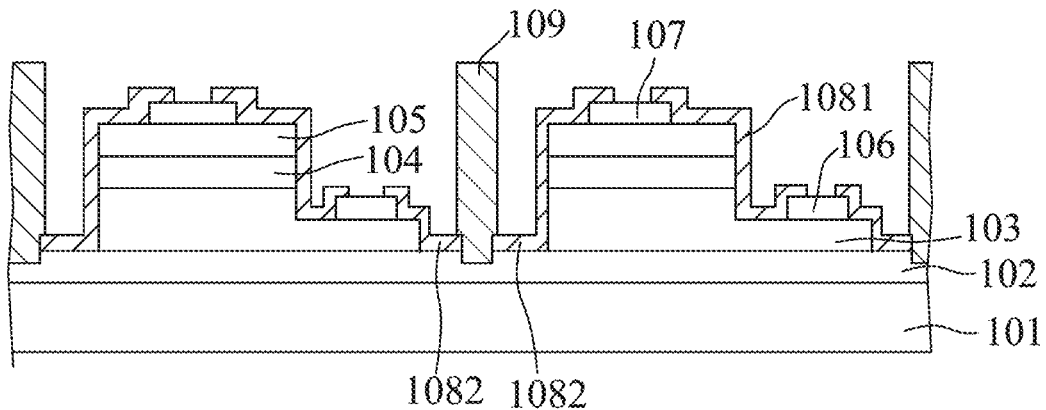
FIG. 9 is a fragmentary, enlarged schematic sectional view illustrating another variation of step 2 of the first embodiment of the production method.

Referring to FIG. 9 (which illustrates another variation of the first embodiment), the intermediate layer 102 may have recesses, each of which is indented from a top surface of the intermediate layer 102 opposite to the temporary substrate 101, and each of which may be formed through etching. Each of the supporting members 109 may be embedded in the intermediate layer 102 by a certain depth in a manner that the bottom part of each of the supporting members 109 is disposed in a respective one of the recesses. Alternatively, when the light emitting devices and the supporting members 109 are directly disposed on the temporary substrate 101 (i.e. the intermediate layer 102 is dispensed with), the temporary substrate 101 may have the aforesaid recesses for having the supporting members 109 embedded in the temporary substrate 101 in the same manner.

Figure 10:
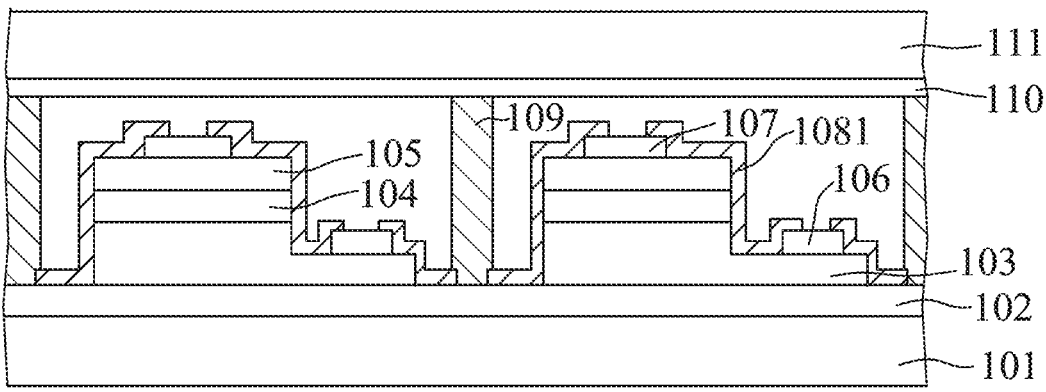
FIG. 10 is a fragmentary, enlarged schematic sectional view illustrating step 3 of the first embodiment of the production method.

In step 3, referring to FIG. 10, a supporting substrate 111 is connected only with the supporting members 109 (i.e. not with the light emitting devices), so that the supporting members 109 respectively extend from the second portions 1082 of the release layers 108 of the light emitting devices to the supporting substrate 111 for supporting the light emitting devices on the supporting substrate 111, and so that the light emitting devices are spaced apart from the supporting substrate 111.

The supporting substrate 111 may be made from a rigid material. Examples of such rigid material include, but are not limited to, sapphire, silicon, glass, and metal.

In this embodiment, the top part of each of the supporting members 109 is indirectly connected with the supporting substrate 111 through an adhesive layer 110 (thus, the light emitting devices are also spaced apart from the adhesion layer 110). The supporting members 109, when made from a curable resin, have already been cured and hardened before connection with the supporting substrate 111, such that the adhesive layer 110 is required to connect the supporting members 109 and the supporting substrate 111.

The adhesive layer 110 may be made from a metal adhesive or a curable resin. Exemplary curable resins include, but are not limited to, a BCB resin, a PI resin, and an epoxy resin. To connect the supporting substrate 111 and the supporting members 109 through the adhesive layer 110 made from a curable resin, the curable resin is first disposed over the supporting substrate 111, the supporting substrate 111 is then disposed on the top part of each of the supporting members 109 in a manner that the curable resin on the the supporting substrate 111 is brought in contact with the top part of each of the supporting members 109, and the curable resin is subsequently subjected to heating or ultraviolet irradiation to be cured so as to form the hardened adhesive layer 110.

Figure 11:
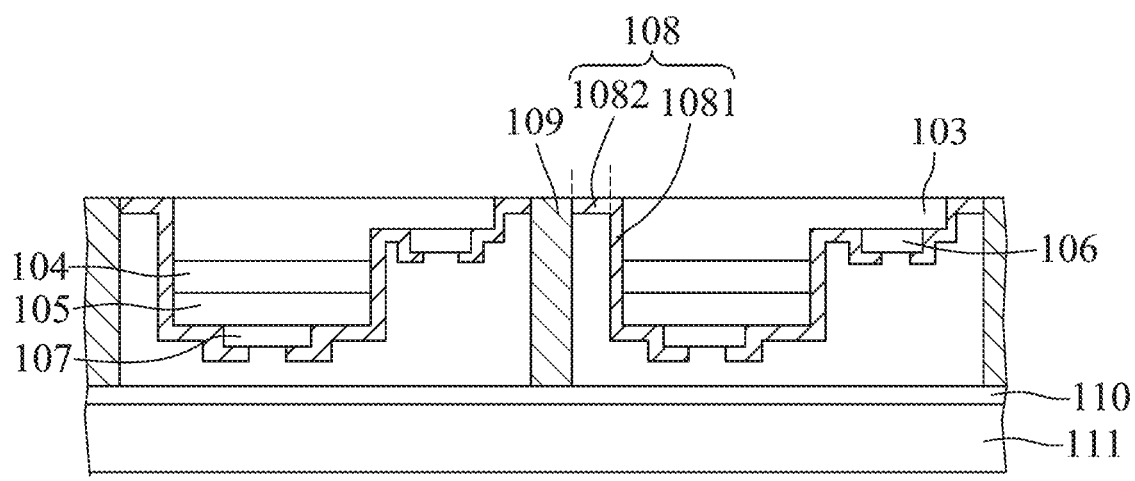
FIG. 11 is a fragmentary, enlarged schematic sectional view illustrating the transferrable array produced after step 4 of the first embodiment of the production method.
Figure 12:
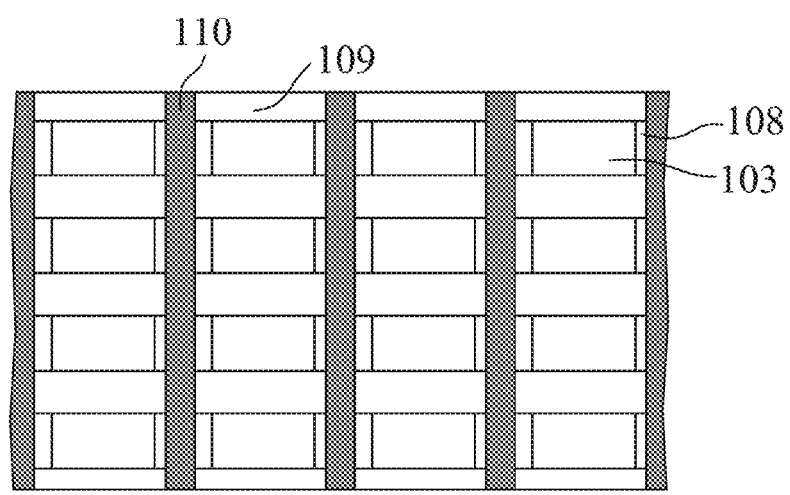
FIG. 12 is a fragmentary, enlarged schematic top view illustrating the transferrable array shown in FIG. 11.

In step 4, as shown in FIGS. 11 and 12, the temporary substrate 101 and the intermediate layer 102 are removed, such that the first embodiment of the transferable array of light emitting devices is produced. Alternatively, in the aforesaid variation of the first embodiment, when the intermediate part of the respective supporting member 109 partially rests on the terminal end of one second portion 1082 or the terminal ends of two spaced-apart confronting second portions 1082 (see FIG. 8), the transferable array of light emitting devices thus produced is shown in FIG. 13.

Figure 13:
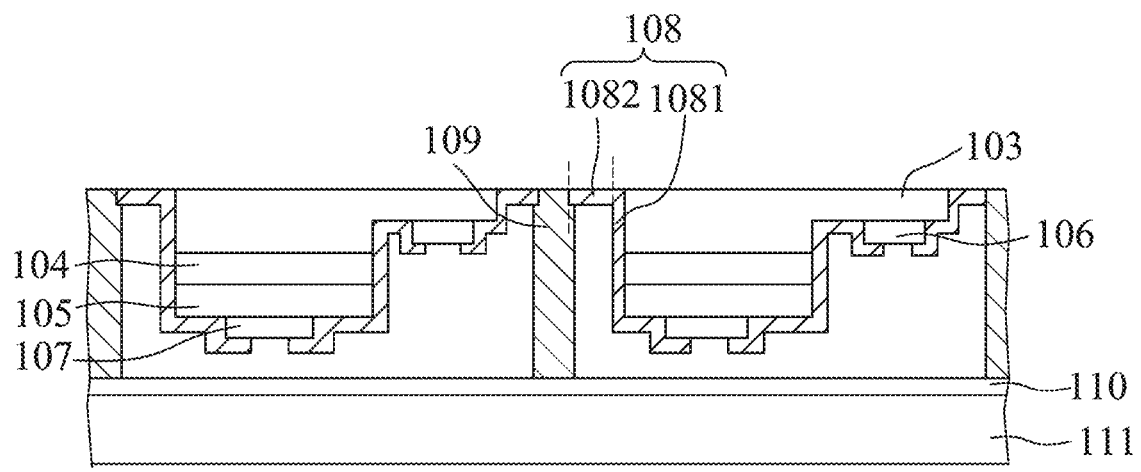
FIG. 13 is a fragmentary, enlarged schematic sectional view illustrating a variation of the transferrable array produced after step 4 of the first embodiment of the production method.

As shown in FIGS. 11 and 13, the light emitting devices are supported and suspended by the bridge structures, and the bottom part of the respective supporting member 109 may be flush with the surface(s) of the corresponding second portion(s) 1082 previously facing toward the intermediate layer 102. Alternatively, when the bottom part of the respective supporting member 109 is disposed in the corresponding recess of the intermediate layer 102 as shown in FIG. 9, after the removal of the temporary substrate 101 and the intermediate layer 102, the bottom part of the respective supporting member 109 is not flush with the surface(s) of the corresponding second portion(s) 1082 previously facing toward the intermediate layer 102.

Based on the material of the temporary substrate 101, removal of the temporary substrate 101 may be conducted through at least one of the following techniques: laser ablation, wet etching, and grinding. For example, the temporary substrate 101 made from sapphire may be removed through a laser ablation process, and the intermediate layer 102 which is a buffer layer may absorb laser and hence be decomposed, so that the temporary substrate 101 and the intermediate layer 102 can be detached from the light emitting devices. Alternatively, the temporary substrate 101 made from gallium arsenide may be removed through a wet etching process, and the intermediate layer which is an etch stop layer (made from, for instance, aluminum gallium indium phosphide) may have a slower etching rate or a non-reactive chemical property in an etching solution compared to the temporary substrate 101 made from gallium arsenide, so that the wet etching process can be controlled to prevent the light emitting devices from being undesiredly etched.

After the removal of the temporary substrate 101 and the intermediate layer 102, the lower surfaces of the the light emitting structures of the light emitting devices (i.e. surfaces of the first-type semiconductor layer portions 103 of the light emitting structures previously facing toward the intermediate layer 102) and surfaces of the second portions 1082 of the release layers 108 of the light emitting devices previously facing toward the intermediate layer 102 are exposed. Therefore, the second portions 1082 of the release layers 108 are respectively suspended by the first portions 1081 of the release layers 108, and the bridge structures formed by the supporting members 109 and the corresponding second portions 1082 of the release layers 108 support the light emitting devices on the supporting substrate 111.

To achieve stable and secure connection to the respective supporting member 109 for supporting the light emitting devices on the supporting substrate 111, each release layer 108 has a satisfactory mechanical strength and may be made from a rigid material (e.g. silicon nitride, silicon oxide, etc.). Nevertheless, when the light emitting devices are transferred from the supporting substrate 111 (the details of such transfer is described later below), one or two second portions 1082 of each release layer 108 can undergo desired fracture under exertion of an external force (see, for example, FIG. 36), or, alternatively, one or two second portions 1082 of each release layer 108 can undergo desired breakage of adhesion to be detached from the corresponding supporting member(s) 109 under exertion of an external force (see, for example, FIG. 37).

The advantage of the transferable array of light emitting devices and that of the production method thereof according to the present disclosure reside in that since a conventional sacrificial layer is dispensed with, a wet etching process is not required to remove such sacrificial layer, thereby preventing the light emitting devices from being negatively influenced. In addition, due to the bridge structures (which can securely and stably support the light emitting devices on the supporting substrate 111) and the release layers 108 (which can be broken or detached when needed), the success rate of transferring the light emitting devices is satisfactory.

FIGS. 14 to 22 illustrate a second embodiment of the transferable array of light emitting devices, a second embodiment of the method for producing the second embodiment of the transferable array, and variations thereof. The second embodiment of the transferable array and the production method are generally similar to the first embodiment, except for the following differences.

Figure 14:
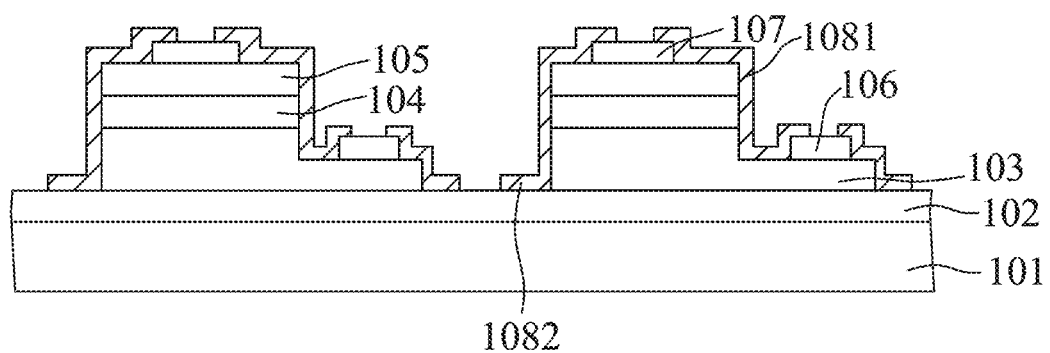
FIG. 14 is a fragmentary, enlarged schematic sectional view illustrating the light emitting devices obtained after step 1 of a second embodiment of the production method.
Figure 15:
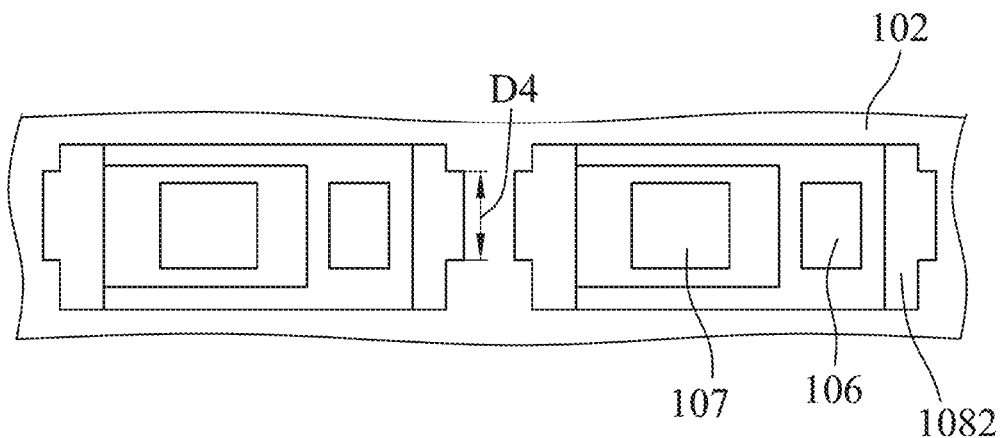
FIG. 15 is a fragmentary, enlarged schematic top view illustrating the light emitting devices obtained after step 1 of the second embodiment of the production method.
Figure 16:
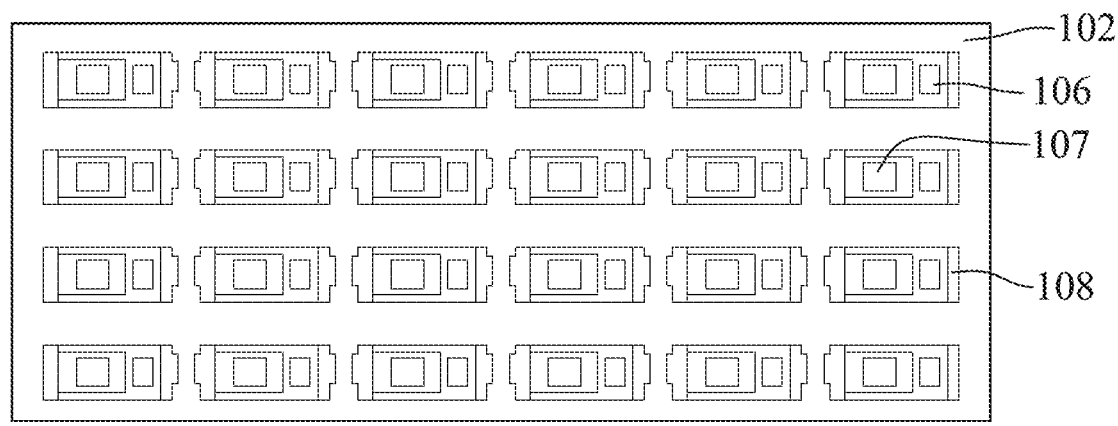
FIG. 16 is a schematic top view illustrating the light emitting devices shown in FIG. 15.

FIGS. 14 to 16 show the light emitting devices obtained after step 1 of the production method.

Referring to FIGS. 15 and 16, the two second portions 1082 of the release layer 108 of the respective one of the light emitting devices arranged in non-terminal columns both have a reduced length D4 that extends in a first direction, and that is smaller than the width of the corresponding light emitting structure extending in the first direction. Regarding the respective one of the light emitting devices arranged in terminal columns (i.e. the leftmost and rightmost columns in FIG. 16), one of the second portions 1082 has the reduced length D4, and the other one of the second portions 1082 has a non-reduced length. The reduced length D4 may be less than or equal to 12 μm (for example, a length ranging from 6 μm to 12 μm).

Figure 17:
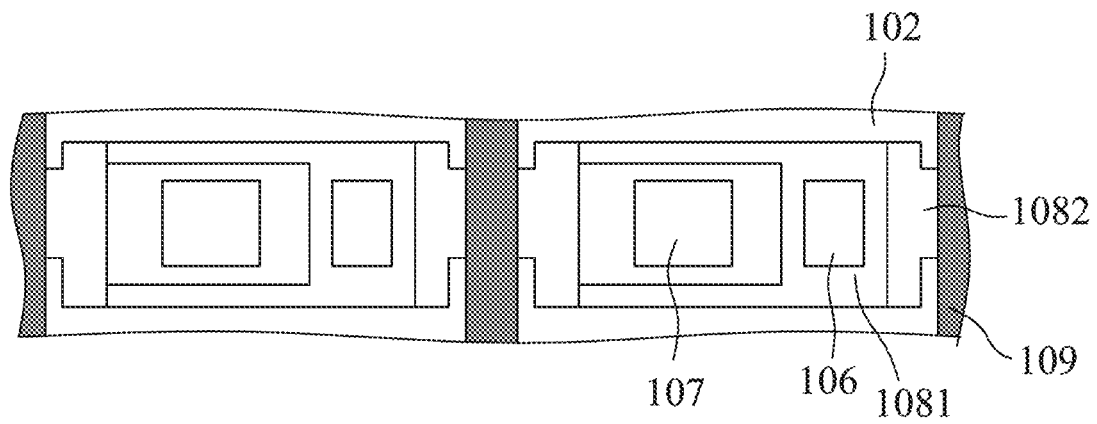
FIG. 17 is a fragmentary, enlarged schematic top view illustrating the light emitting devices and supporting members obtained after step 2 of the second embodiment of the production method.
Figure 18:
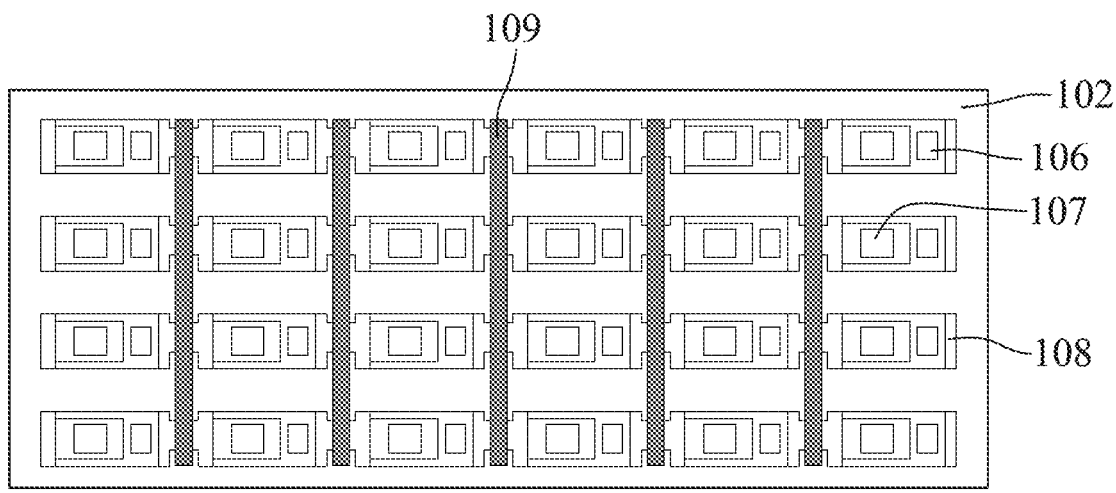
FIG. 18 is a schematic top view illustrating the light emitting devices and the supporting members shown in FIG. 17.

FIGS. 17 and 18 show the light emitting devices and the supporting members 109 obtained after step 2 of the production method. As shown in these drawings, the supporting members 109 in the second embodiment are disposed in a manner generally similar to that of the supporting members 109 in the first embodiment, except that each of the supporting members 109 is disposed between two spaced-apart confronting second portions 1082 having the reduced length D4 (namely, no supporting member 109 is connected to the second portions 1082 having the non-reduced length, and hence the terminal supporting members 109 shown in FIG. 6 are dispensed with).

Figure 19:
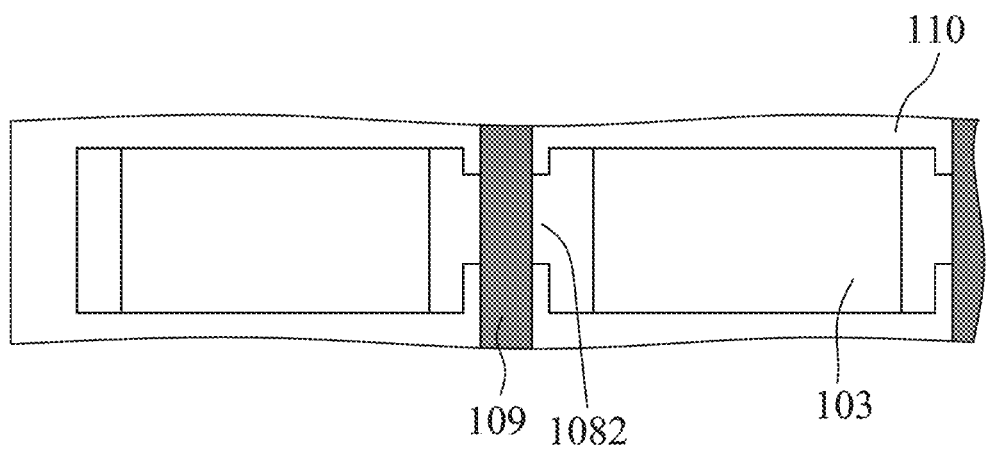
FIG. 19 is a fragmentary, enlarged schematic top view illustrating the transferrable array produced after step 4 of the second embodiment of the production method.
Figure 20:
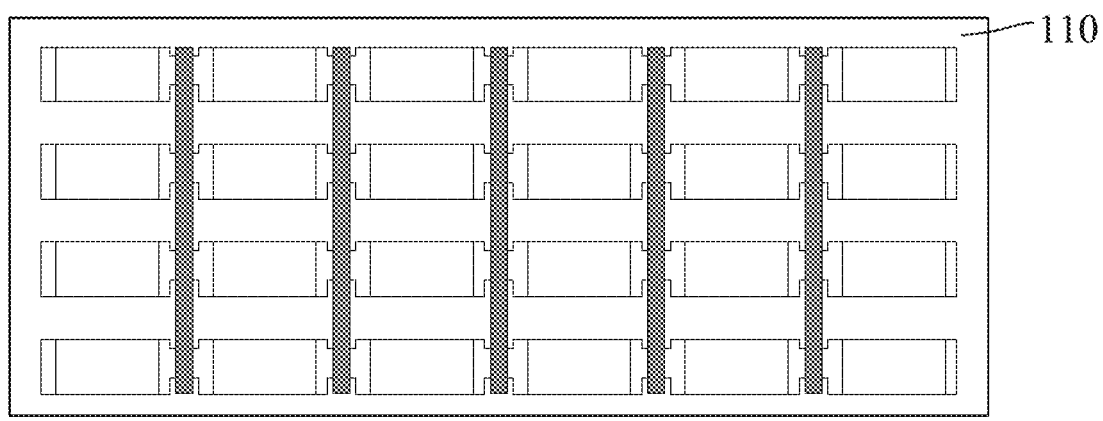
FIG. 20 is a schematic top view illustrating the transferrable array produced shown in FIG. 19.

FIGS. 19 and 20 show the transferable array of light emitting devices obtained after step 4 of the production method. As shown in these drawings, since the second portions 1082 connected to the supporting members 109 have the reduced length, such second portions 1082 can be more easily fractured or detached when needed, such that the light emitting devices can be more easily transferred.

Figure 21:
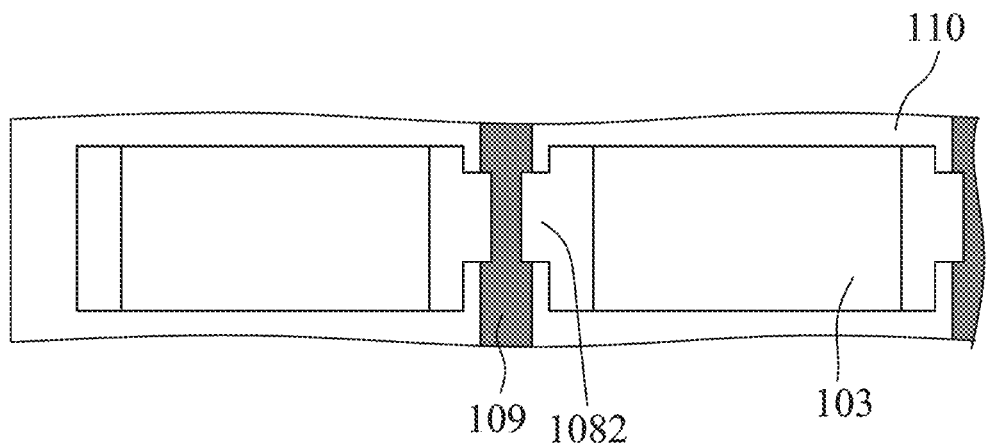
FIG. 21 is a fragmentary, enlarged schematic top view illustrating a variation of the transferrable array produced after step 4 of the second embodiment of the production method.
Figure 22:
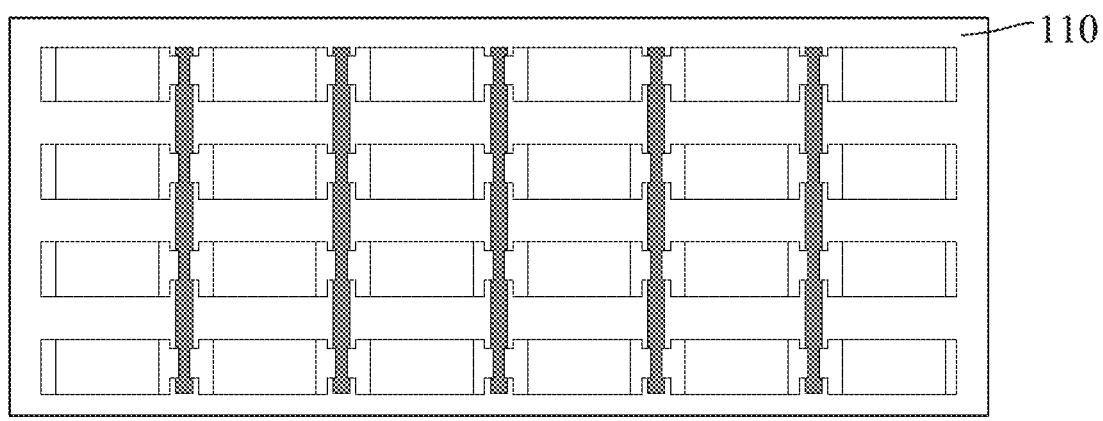
FIG. 22 is a schematic top view illustrating the variation of the transferrable array shown in FIG. 21.

FIGS. 21 and 22 show the transferable array of light emitting devices that is obtained after step 4 of the production method, and that is generally similar to the transferable array shown in FIGS. 19 and 20. However, the supporting members 109 shown in FIGS. 21 and 22 are structurally the same as those shown in FIG. 8.

FIGS. 23 to 29 illustrate a third embodiment of the transferable array of light emitting devices, a third embodiment of the method for producing the third embodiment of the transferable array, and variations thereof. The third embodiment of the transferable array and the production method are generally similar to the first embodiment, except for the following differences.

Figure 23:
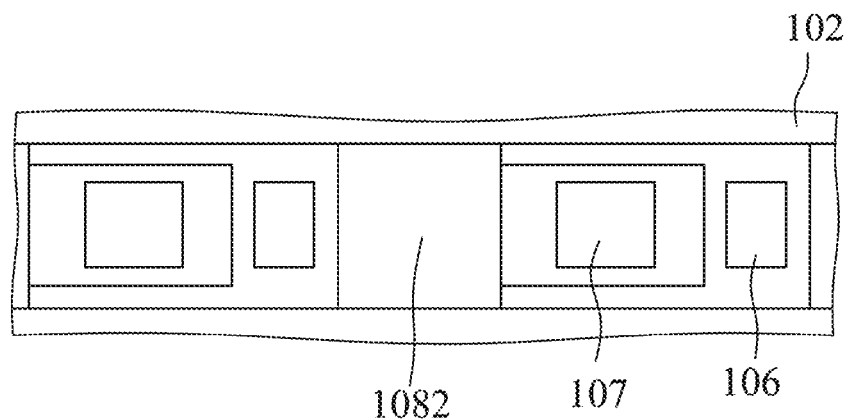
FIG. 23 is a fragmentary, enlarged schematic top view illustrating the light emitting devices obtained after step 1 of a third embodiment of the production method.

Referring to FIG. 23, after step 1 of the production method, the confronting second portions 1082 of the release layers 108 of the two adjacent ones of the light emitting devices arranged in a row are connected to each other. A supporting member 109 is to be formed over the connected confronting second portions 1082 of the two adjacent ones of the light emitting devices arranged in a row.

Figure 24:
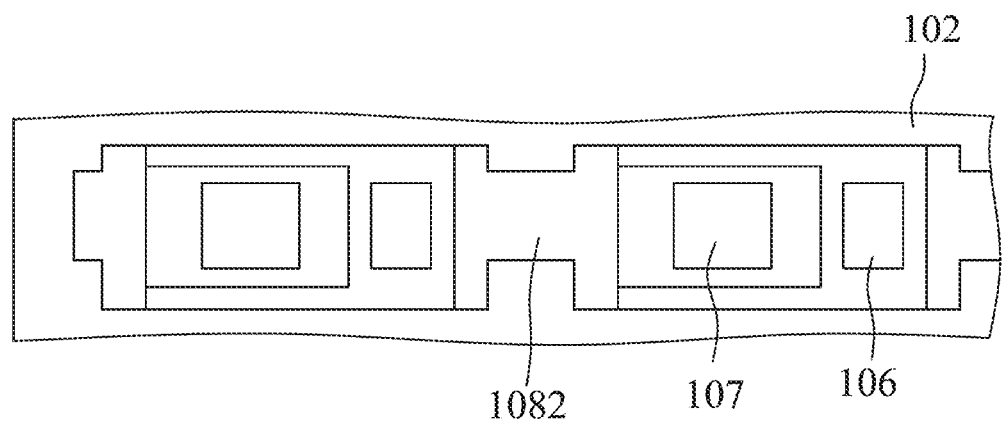
FIG. 24 is a fragmentary, enlarged schematic top view illustrating a variation of the light emitting devices obtained after step 1 of the third embodiment of the production method.
Figure 25:
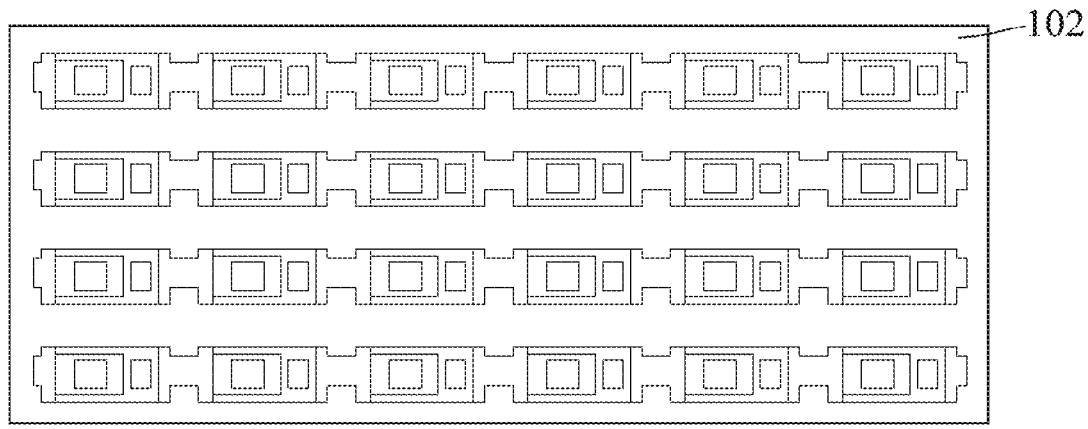
FIG. 25 is a schematic top view illustrating the variation of the light emitting devices shown in FIG. 24.
Figure 26:
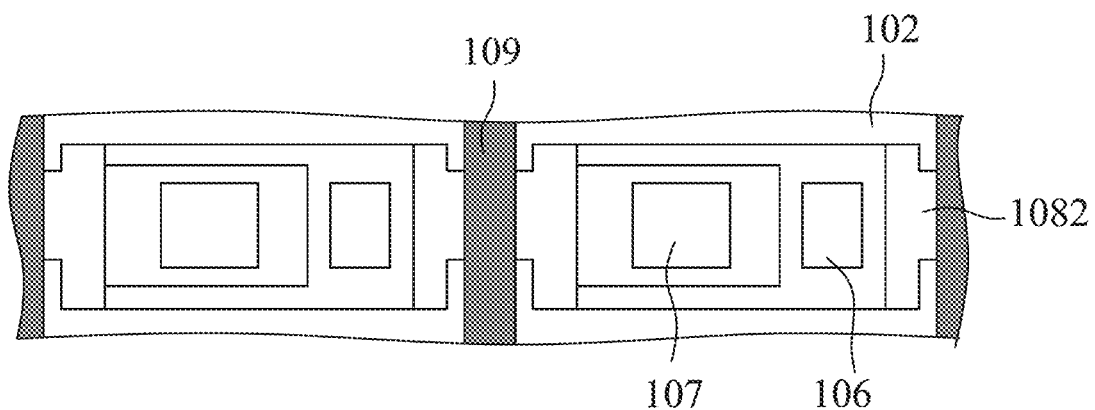
FIG. 26 is a fragmentary, enlarged schematic top view illustrating arrangement of the variation of the light emitting devices shown in FIG. 24 and the supporting members after step 2 of the third embodiment of the production method.
Figure 27:
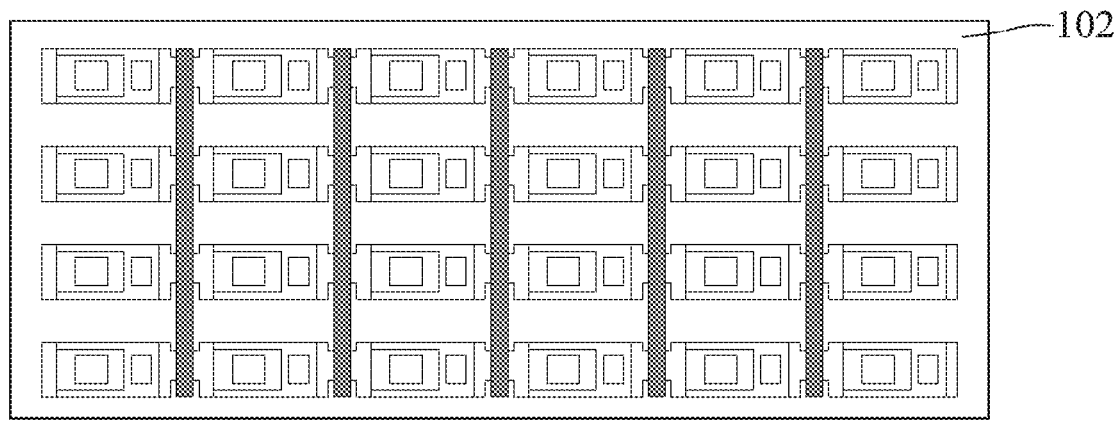
FIG. 27 is a schematic top view illustrating the arrangement shown in FIG. 26.

Alternatively, as shown in FIGS. 24 and 25, the light emitting devices obtained after step 1 of the production method are similar to those shown in FIG. 15 in that the confronting second portions 1082 of the release layers 108 of the two adjacent ones of the light emitting devices arranged in a row have the reduced length D4. However, the confronting second portions 1082 of the release layers 108 of the two adjacent ones of the light emitting devices arranged in a row are connected to each other. After step 2 of the production method, as shown in FIGS. 26 and 27, each supporting member 109 is disposed over the two confronting second portions 1082 having the reduced length D4. Specifically, the bottom part of each supporting member 109 is partially disposed over the two confronting second portions 1082 having the reduced length D4, and is partially disposed over the intermediate layer 102 (i.e. indirectly over the temporary substrate 101).

Figure 28:
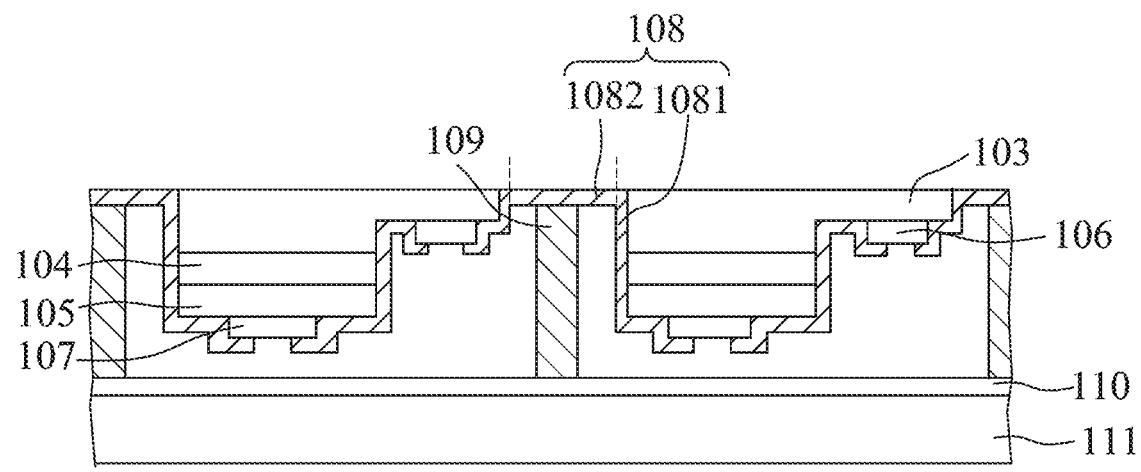
FIG. 28 is a fragmentary, enlarged schematic sectional view illustrating the transferrable array that is produced after step 4 of the third embodiment of the production method, and that includes the variation of the light emitting devices shown in FIG. 24 and the supporting members.
Figure 29:
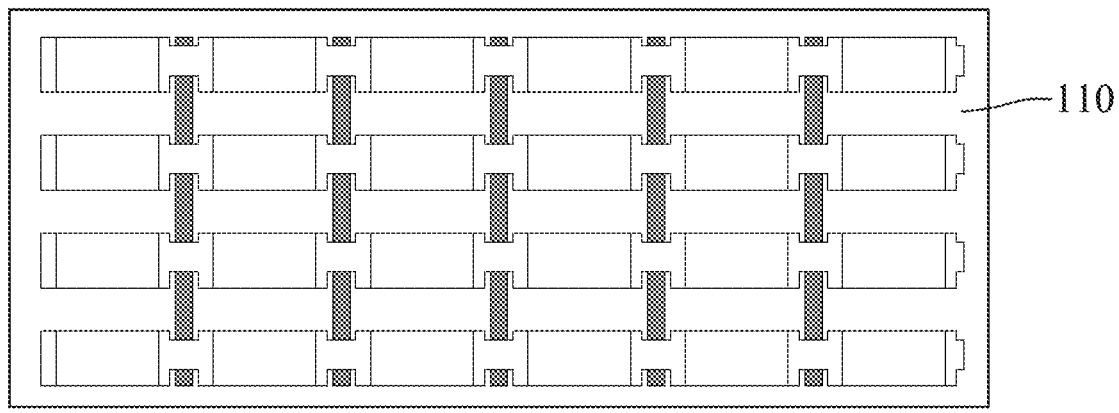
FIG. 29 is a schematic top view illustrating the transferrable array shown in FIG. 28.

Whether the two confronting second portions 1082 have the reduced length D4 or not, referring to FIGS. 28 and 29, after step 4 of the production method (i.e. the removal of the intermediate layer 102 and the temporary substrate 101), the bottom part of each supporting member 109 supports and adheres to the two confronting second portions 1082.

Figure 30:
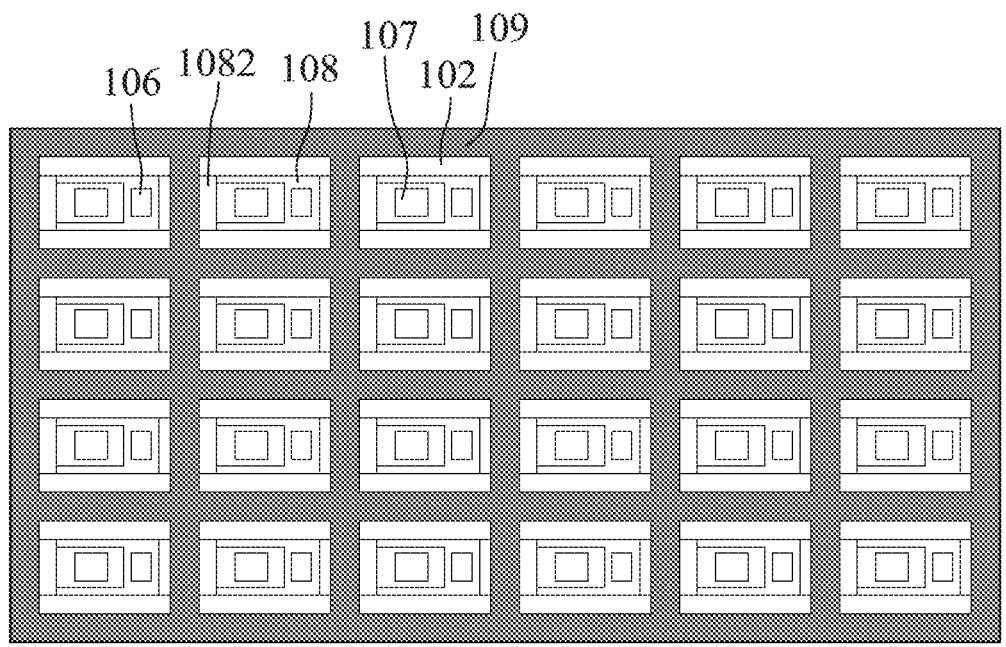
FIG. 30 is a schematic top view illustrating step 2 of a fourth embodiment of the production method.
Figure 31:
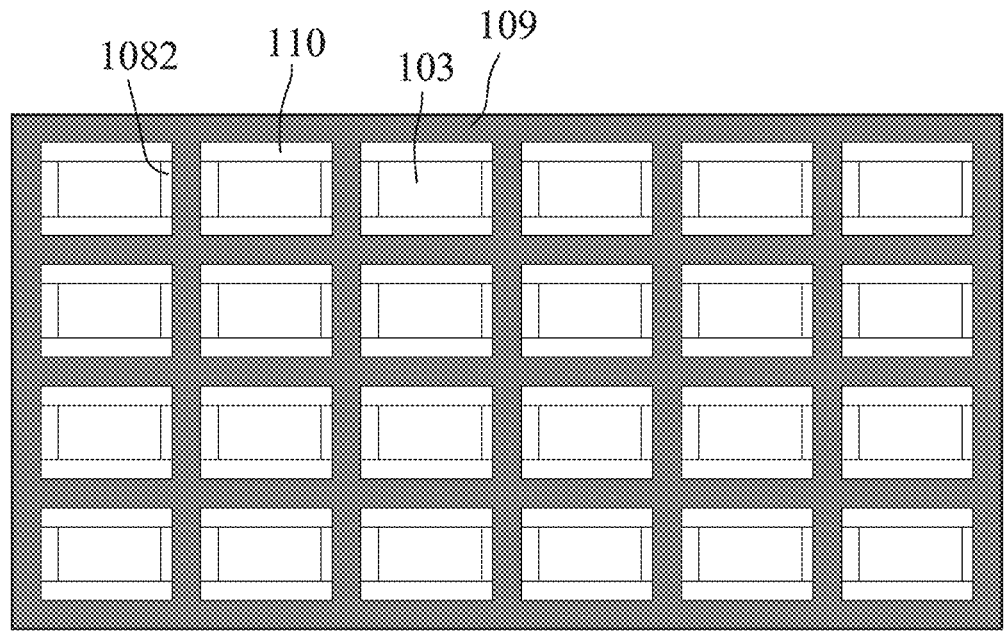
FIG. 31 is schematic top view illustrating the transferrable array produced after step 4 of the fourth embodiment of the production method.

FIGS. 30 to 31 illustrate a fourth embodiment of the transferable array of light emitting devices, and a fourth embodiment of the method for producing the fourth embodiment of the transferable array. The fourth embodiment of the transferable array and the production method are generally similar to the first embodiment, except for the following differences.

Referring to FIG. 30, after step 2 of the production method, the supporting members 109 formed are supporting frames. Each of the supporting frames surrounds the respective one of the light emitting devices, and exposes parts of the intermediate layer 102 adjacent to the the respective one of the light emitting devices where no second portion 1082 is formed. In addition, the first-type semiconductor layer portions 103 shown in FIG. 30 are different in length from those shown in FIG. 6.

As shown in FIG. 31, after step 4 of the production method (i.e. the removal of the intermediate layer 102 and the temporary substrate 101), the supporting frames support the light emitting devices on the adhesive layer 110 (i.e. indirectly on the supporting substrate 111).

Figure 32:
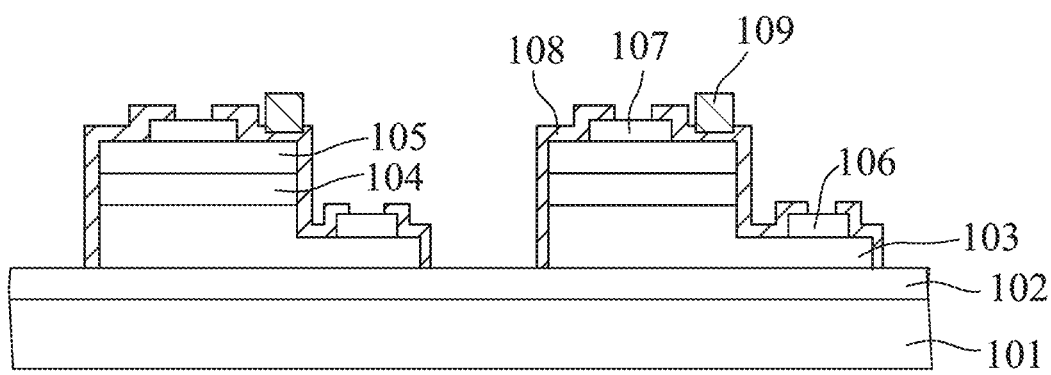
FIG. 32 is a fragmentary, enlarged schematic sectional view illustrating step 2 of a fifth embodiment of the production method.
Figure 33:
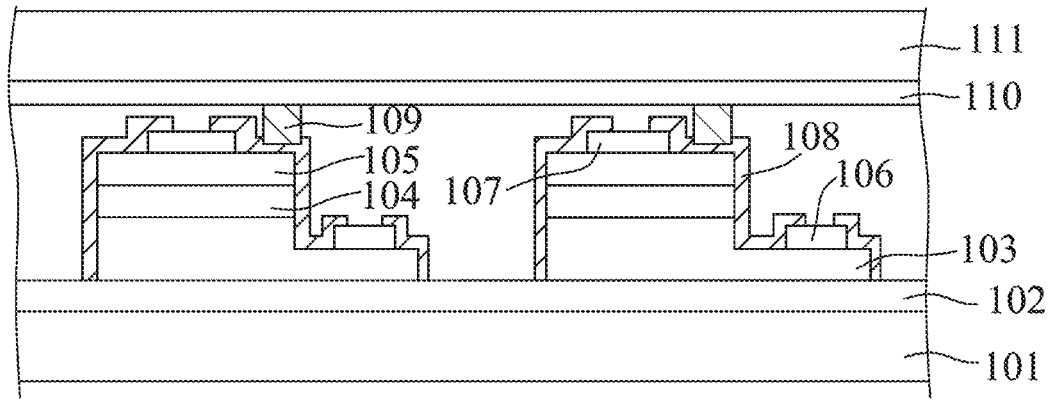
FIG. 33 is a fragmentary, enlarged schematic sectional view illustrating step 3 of the fifth embodiment of the production method.
Figure 34:
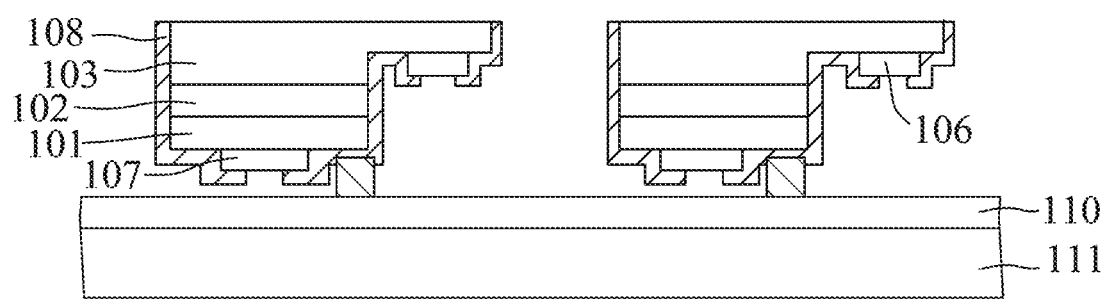
FIG. 34 is a fragmentary, enlarged schematic sectional view illustrating the transferrable array produced after step 4 of the fifth embodiment of the production method.

FIGS. 32 to 34 illustrate a fifth embodiment of the transferable array of light emitting devices, a fifth embodiment of the method for producing the fifth embodiment of the transferable array, and variations thereof. The fifth embodiment of the transferable array and the production method are generally similar to the first embodiment, except for the following differences.

Referring to FIG. 32, after step 2 of the production method, the release layer 108 of each of the light emitting devices is directly connected to the respective one of the supporting members 109 formed. Specifically, the bottom part of each of the supporting members 109 is disposed over and directly connected to a top portion of the release layer 108 which is disposed over the upper surface of the light emitting structure of the corresponding one of the light emitting devices (i.e. an upper surface of the corresponding second-type semiconductor layer portion 105 in this embodiment). The release layer 108 of each of the light emitting devices in this embodiment have no second portion 1082 described above. To respectively form the supporting members 109 on the light emitting devices, a suitable material may be patterned through, for example, photolithography or lift-off.

In this embodiment, the top portion of the release layer 108 of each of the light emitting devices has a non-through recess, which is indented toward the corresponding second-type semiconductor layer portion 105 and does not expose the same, and in which the respective one of the supporting members 109 is disposed. Alternatively, the top portion of the release layer 108 of each of the light emitting devices may have a through recess, which is indented toward the corresponding second-type semiconductor layer portion 105 to expose the same, and in which the respective one of the supporting members 109 is disposed (not shown in the drawings). Still alternatively, the top portion of the release layer 108 of each of the light emitting devices may have no non-through recess and no through recess, and each of the supporting members 109 may be directly disposed on the top portion of the release layer 108 of the respective light emitting device (not shown in the drawings).

As shown in FIG. 33, after step 3 of the production method, each of the supporting members 109 extend from the top portion of the release layer 108 of the respective light emitting device to the adhesive layer 110 (i.e. indirectly to the supporting substrate 111). Therefore, as shown in FIG. 34, after step 4 of the production method (i.e. the removal of the intermediate layer 102 and the temporary substrate 101), each of the supporting members 109 supports the respective light emitting device on the adhesive layer 110 (i.e. indirectly on the supporting substrate 111).

FIGS. 35 to 38 illustrate transfer of the transferable array of light emitting devices according to the present disclosure.

Figure 35:
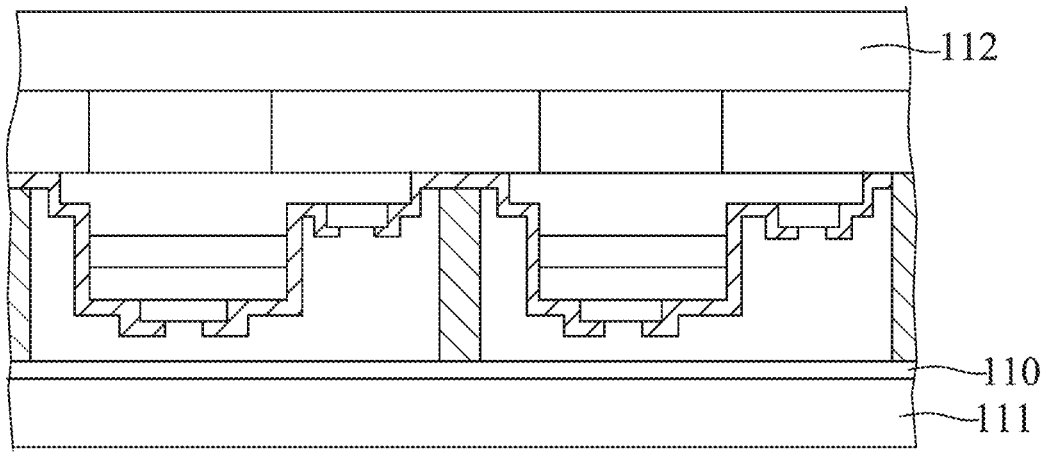
FIGS. 35 and 36 are fragmentary, enlarged schematic sectional views respectively illustrating that the transferrable array shown in FIG. 11 is transferred using a stamp, and that second portions of release layers of the light emitting devices are broken for transfer.
Figure 36:
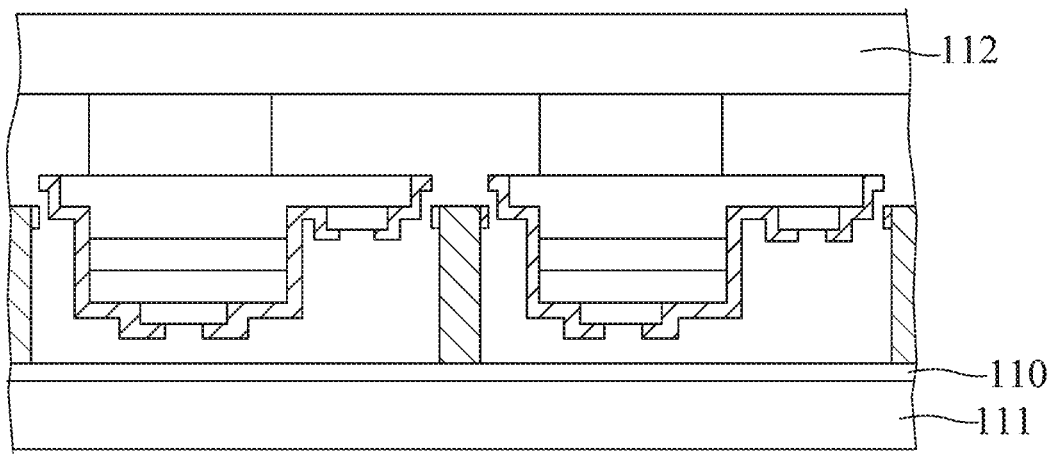

The first embodiment of the transferable array shown in FIG. 11 may be transferred as follows. Referring to FIG. 35, a polydimethylsiloxane (PDMS) stamp 112 is used to transfer the light emitting devices in micro size to a flexible substrate or a glass substrate so as to produce a micrLED display. Specifically, the PDMS stamp 112 is disposed in contact with the lower surface of the light emitting structure of each light emitting device, so that the PDMS stamp 112 adheres to such lower surface by virtue of van der Waals forces. Subsequently, as shown in FIG. 36, an external force is applied to the PDMS stamp 112 to break the second portions 1082 of the release layers 108 of the light emitting devices. Therefore, the light emitting devices in an array can be transferred from the supporting substrate 111 to the desired flexible substrate or glass substrate.

Figure 37:
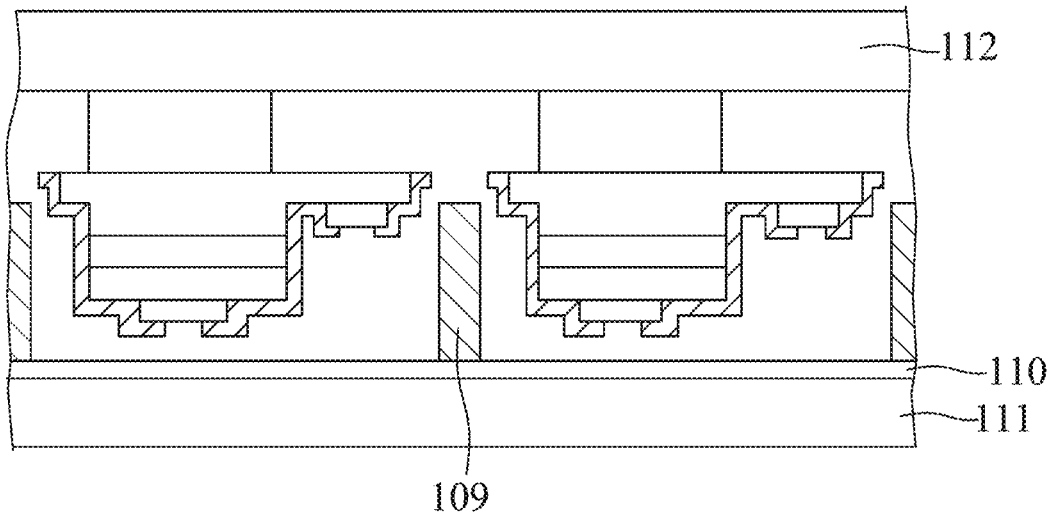
FIG. 37 is a fragmentary, enlarged schematic sectional view illustrating that the transferrable array shown in FIG. 11 is transferred using the stamp by breaking adhesion between the supporting members and the second portions of the release layers of the light emitting devices.

Alternatively, referring to FIG. 37, an external force may be applied to the PDMS stamp 112 to break adhesion between each supporting member 109 and the second portion 1082 of the release layer 108 of one or two light emitting devices, so that each supporting member 109 can be detached from the corresponding second portion(s) 1082 for transfer of the light emitting devices.

Figure 38:
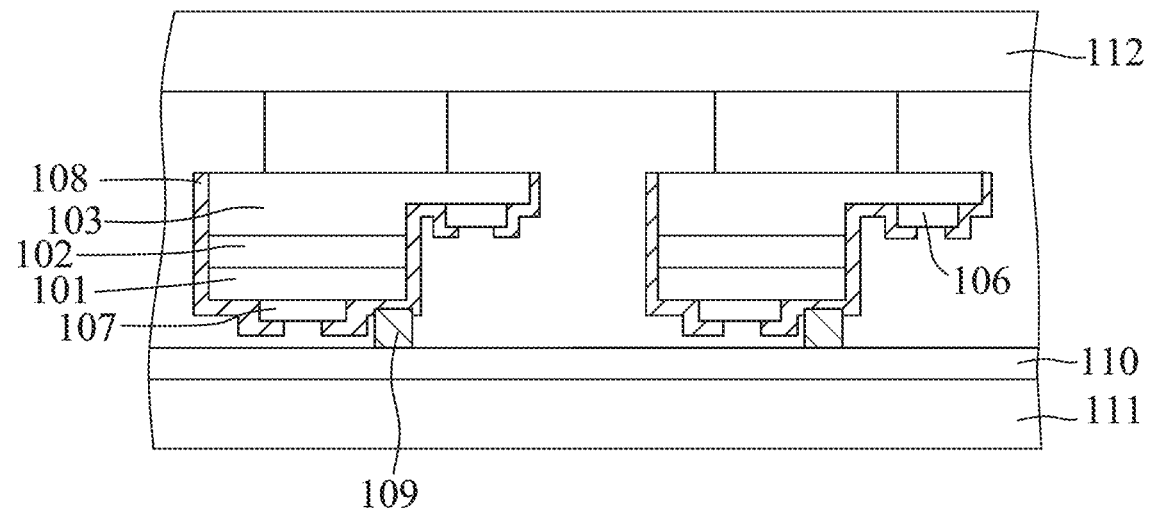
FIG. 38 is a fragmentary, enlarged schematic sectional view illustrating that the transferrable array shown in FIG. 34 is transferred using the stamp.

Referring to FIG. 38, the fifth embodiment of the transferable array shown in FIG. 34 may be transferred also using the PDMS stamp 112. Similar to the transfer of the first embodiment described above, after the PDMS stamp 112 is disposed in contact with the lower surface of the light emitting structure of each light emitting device, an external force may be applied to the PDMS stamp 112 to break adhesion between each supporting member 109 and the top portion of the release layer 108 of the corresponding light emitting device, or, alternatively, an external force may be applied to the PDMS stamp 112 to break each supporting member 109 per se.

A sixth embodiment of the transferable array and the production method are generally similar to the first embodiment, except that each supporting member 109 is bonded to the second portion 1082 of the release layer 108 of one or two light emitting devices so as to adhere to the same. Precise positioning of the supporting members 109 may facilitate the bonding of the same to the second portions 1082 of the release layers 108.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method for producing a transferable array of light emitting devices, comprising:
   forming, on a temporary substrate, a plurality of light emitting devices, each of which includes a light emitting structure and a release layer disposed over the light emitting structure;
   forming at least one supporting member so that the at least one supporting member is directly connected to the release layer of at least one of the light emitting devices, the at least one supporting member being made from a curable resin;
   connecting a supporting substrate only with the at least one supporting member so that the at least one supporting member extends from the release layer of the at least one of the light emitting devices to the supporting substrate for supporting the light emitting devices on the supporting substrate, and so that each of the light emitting devices is spaced apart from the supporting substrate by an air gap; and
   removing the temporary substrate,
   wherein the method further includes:
   before formation of the light emitting devices, forming an intermediate layer on the temporary substrate such that the light emitting devices are formed on the intermediate layer opposite to the temporary substrate; and
   after connection of the supporting substrate only with the at least one supporting member, removing the intermediate layer, and
   wherein the intermediate layer has at least one recess indented from a top surface of the intermediate layer opposite to the temporary substrate, the at least one supporting member having a bottom part and embedded in the intermediate layer in a manner that the bottom part is disposed in the at least one recess.

2. The method of claim 1, wherein the release layer of each of the light emitting devices is further disposed on the temporary substrate, and has a first portion that is disposed over the light emitting structure of a respective one of the light emitting devices, and at least one second portion that extends from the first portion to terminate at a terminal end and is disposed only on the temporary substrate, the at least one supporting member further having a top part connected with the supporting substrate, and an intermediate part interconnecting the top and bottom parts, one of the bottom and intermediate parts being directly connected to the second portion of the release layer of the at least one of the light emitting devices to form a bridge structure that supports the light emitting devices on the supporting substrate.

3. The method of claim 2, wherein a plurality of the supporting members are disposed on the temporary substrate, the supporting members being selected from supporting pillars in an array, supporting mesa components for forming supporting mesas in an array, and patterned supporting frames.

4. The method of claim 2, wherein the at least one supporting member has a height greater than that of each of the light emitting devices, and is connected only to the second portion of the release layer of the at least one of the light emitting devices.

5. The method of claim 2, wherein the confronting second portions of the release layers of two adjacent ones of the light emitting devices are spaced apart from each other, the supporting member being disposed between the spaced apart confronting second portions to cooperatively form the bridge structure with the spaced apart confronting second portions.

6. The method of claim 5, wherein the bottom part of the at least one supporting member is disposed completely on the temporary substrate, the at least one supporting member being connected only to the terminal ends of the spaced apart confronting second portions of the release layers of the two adjacent ones of the light emitting devices at the intermediate part of the at least one supporting member.

7. The method of claim 5, wherein the intermediate part of the supporting member is connected to and partially disposed on the spaced apart confronting second portions of the release layers of the two adjacent ones of the light emitting devices.

8. The method of claim 2, wherein the confronting second portions of the release layers of two adjacent ones of the light emitting devices have a reduced length that extends in a first direction, and that is shorter than a width of the corresponding light emitting structure extending in the first direction.

9. The method of claim 1, wherein the light emitting devices have a width of not greater than 100 µm.

10. The method of claim 2, wherein the at least one supporting member is directly connected to the release layer of the at least one of the light emitting devices only at the at least one second portion.

11. The method of claim 1, further comprising disposing an adhesive layer between the at least one supporting member and the supporting substrate, so that the at least one supporting member is connected with the supporting substrate.

12. The method of claim 2, wherein the release layer of each of the light emitting devices has at least one second portion that is disposed at one side of the respective one of the light emitting devices.

13. The method of claim 2, wherein the release layer of each of the light emitting devices has at least two of the second portions that are respectively disposed at sides of a corresponding one of the light emitting devices.

14. The method of claim 1, wherein the release layer of each of the light emitting devices is an insulation layer, and is disposed over a surface of the light emitting structure of a corresponding one of the light emitting devices.

\* \* \* \* \*